(12) United States Patent
Labrenz et al.

(10) Patent No.: US 12,707,979 B2
(45) Date of Patent: Aug. 11, 2026

(54) SEMICONDUCTOR DEVICE HAVING AN ISOLATION REGION WITH A RECESS AND METHOD OF MANUFACTURING THE SEMICONDUCTOR DEVICE

(71) Applicant: Infineon Technologies Austria AG, Villach (AT)

(72) Inventors: Norbert Labrenz, Dresden (DE); Alim Karmous, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 423 days.

(21) Appl. No.: 18/225,472

(22) Filed: Jul. 24, 2023

(65) Prior Publication Data

US 2024/0047379 A1 Feb. 8, 2024

(30) Foreign Application Priority Data

Aug. 5, 2022 (DE) ......................... 102022208175.7

(51) Int. Cl.
*H10W 42/00* (2026.01)
*H10D 64/27* (2025.01)
(Continued)

(52) U.S. Cl.
CPC ........ *H10W 42/121* (2026.01); *H10D 64/513* (2025.01); *H10D 84/811* (2025.01);
(Continued)

(58) Field of Classification Search
CPC ............... H01L 23/562; H01L 21/3212; H01L 21/76205; H01L 21/76224; H01L 23/28;
(Continued)

(56) References Cited

U.S. PATENT DOCUMENTS 5,362,669 A * 11/1994 Boyd ................ H01L 21/76229 438/692
5,726,084 A * 3/1998 Boyd ................ H01L 21/31053 438/296
(Continued)

FOREIGN PATENT DOCUMENTS

DE 102021104532 A1 8/2022
JP H10284739 A * 10/1998

OTHER PUBLICATIONS

Merriam-Webster Dictionary, Definition for the term parallel, [online], [retrieved on Dec. 6, 2025], Retrieved from the Internet: <URL https://www.merriam-webster.com/dictionary/parallel> pp. 1-4.*
Steven M. Kaplan, Wiley Electrical and Electronics Engineering Dictionary, Definition for Active Device p. 11 (Year: 2004).*
Steven M. Kaplan, Wiley Electrical and Electronics Engineering Dictionary, Definition for Passive Device p. 556 (Year: 2004).*

*Primary Examiner* — Caleen O Sullivan
*Assistant Examiner* — Brett Squires
(74) *Attorney, Agent, or Firm* — Murphy, Bilak & Homiller, PLLC

(57) ABSTRACT

A semiconductor device is provided. The semiconductor device includes a substrate, an isolation region that is formed at a main surface of the substrate, and a recess in the isolation region. The semiconductor device further includes an active or passive device that is formed in the recess. The active or passive device includes a first semiconductor material region and a second semiconductor material region. The first semiconductor material region adjoins at least part of the second semiconductor material region in a first direction parallel to the main surface of the substrate. An upper surface of the first semiconductor material region is above an upper surface of the second semiconductor material region. The upper surface of the second semiconductor material region is below the main surface of the substrate.

20 Claims, 7 Drawing Sheets

(51) Int. Cl.
*H10D 84/80* (2025.01)
*H10P 52/40* (2026.01)
*H10W 10/00* (2026.01)
*H10W 10/13* (2026.01)
*H10W 10/17* (2026.01)

(52) U.S. Cl.
CPC .......... *H10P 52/402* (2026.01); *H10P 52/403* (2026.01); *H10W 10/0121* (2026.01); *H10W 10/014* (2026.01); *H10W 10/13* (2026.01); *H10W 10/17* (2026.01)

(58) Field of Classification Search
CPC ....... H01L 23/29; H01L 23/31; H10D 64/513; H10D 84/811; H10N 30/883; H10W 42/121; H10W 10/014; H10W 10/17; H10W 10/0121; H10W 10/13; H10P 52/402; H10P 52/403
See application file for complete search history.

(56) References Cited

U.S. PATENT DOCUMENTS

| | | | | |
|---|---|---|---|---|
| 6,242,805 | B1 * | 6/2001 | Weling | H01L 21/3212 438/692 |
| 2018/0277641 | A1 | 9/2018 | Karmous | |
| 2019/0279875 | A1 | 9/2019 | Karmous | |

* cited by examiner

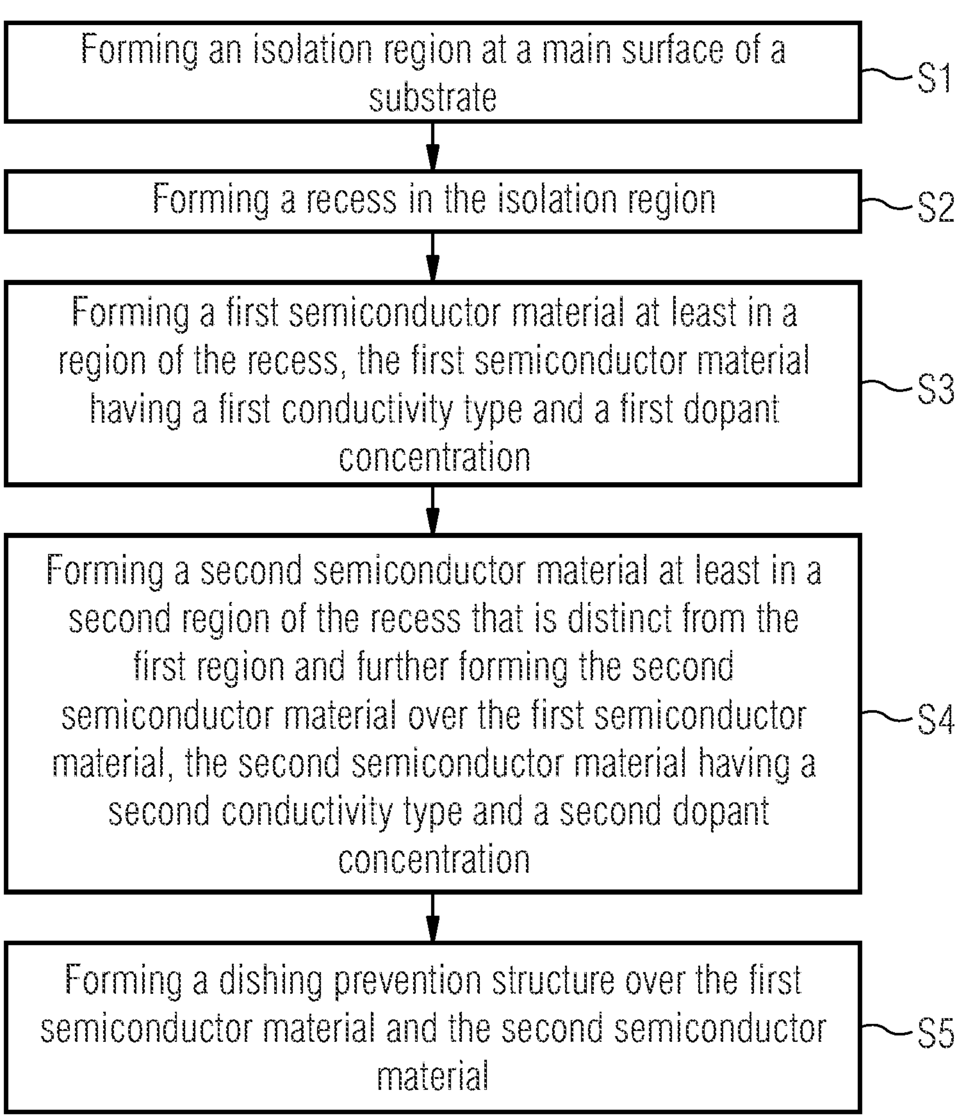
FIG 7
Forming an isolation region at a main surface of a substrate
S1
Forming a recess in the isolation region
S2
Forming a first semiconductor material at least in a region of the recess, the first semiconductor material having a first conductivity type and a first dopant concentration
S3
Forming a second semiconductor material at least in a second region of the recess that is distinct from the first region and further forming the second semiconductor material over the first semiconductor material, the second semiconductor material having a second conductivity type and a second dopant concentration
S4
Forming a dishing prevention structure over the first semiconductor material and the second semiconductor material
S5

SEMICONDUCTOR DEVICE HAVING AN ISOLATION REGION WITH A RECESS AND METHOD OF MANUFACTURING THE SEMICONDUCTOR DEVICE

TECHNICAL FIELD

The present disclosure relates to a semiconductor device and a method of manufacturing a semiconductor device.

BACKGROUND

Chemical Mechanical Polishing/Planarization (CMP) is a technique widely employed in semiconductor manufacturing for planarizing a first layer (or a first layer stack) down to a second layer (or a second layer stack). In the case of structures with wide dimensions such as large metal pads, wide trenches, etc. dishing of the first layer (or first layer stack) occurs in such large structures. Dishing occurs when more material is removed from the center of the structure being planarized, and the cross-section view has the profile of a dish and thus a nonuniform thickness. It is desirable to minimize or at least reduce dishing when planarizing structures with wide dimensions.

SUMMARY

According to an embodiment of a semiconductor device, the semiconductor device comprises a substrate, an isolation region that is formed at a main surface of the substrate, and a recess in the isolation region. The semiconductor device further comprises an active or passive device that is formed in the recess. The active or passive device comprises a first semiconductor material region and a second semiconductor material region. The first semiconductor material region adjoins at least part of the second semiconductor material region in a first direction parallel to the main surface of the substrate. An upper surface of the first semiconductor material region is above an upper surface of the second semiconductor material region and the upper surface of the second semiconductor material region is below the main surface of the substrate.

According to an embodiment of a method of manufacturing a semiconductor device, the method comprises forming an isolation region at a main surface of a substrate, forming a recess in the isolation region, and forming a first semiconductor material at least in a first region of the recess. The first semiconductor material has a first conductivity type and a first doping level. The method further comprises forming a second semiconductor material at least in a second region of the recess that is distinct from the first region and further forming the second semiconductor material over the first semiconductor material. The second semiconductor material has a second conductivity type and a second doping level. The first semiconductor material adjoins at least part of the second semiconductor material in a first direction parallel to the main surface of the substrate. The method further comprises forming a dishing prevention structure over the first semiconductor material and the second semiconductor material.

Those skilled in the art will recognize additional features and advantages upon reading the following detailed description, and upon viewing the accompanying drawings.

BRIEF DESCRIPTION OF THE DRAWINGS

For a more complete understanding of the present invention, and the advantages thereof, reference is now made to the following descriptions taken in conjunction with the accompanying drawings, in which:

FIG. 7 illustrates a flowchart of an exemplary method of manufacturing a semiconductor device.

Corresponding numerals and symbols in different figures generally refer to corresponding parts unless otherwise indicated. The figures are drawn to clearly illustrate the relevant aspects of the preferred examples and are not necessarily drawn to scale.

DETAILED DESCRIPTION

Figure 1A:
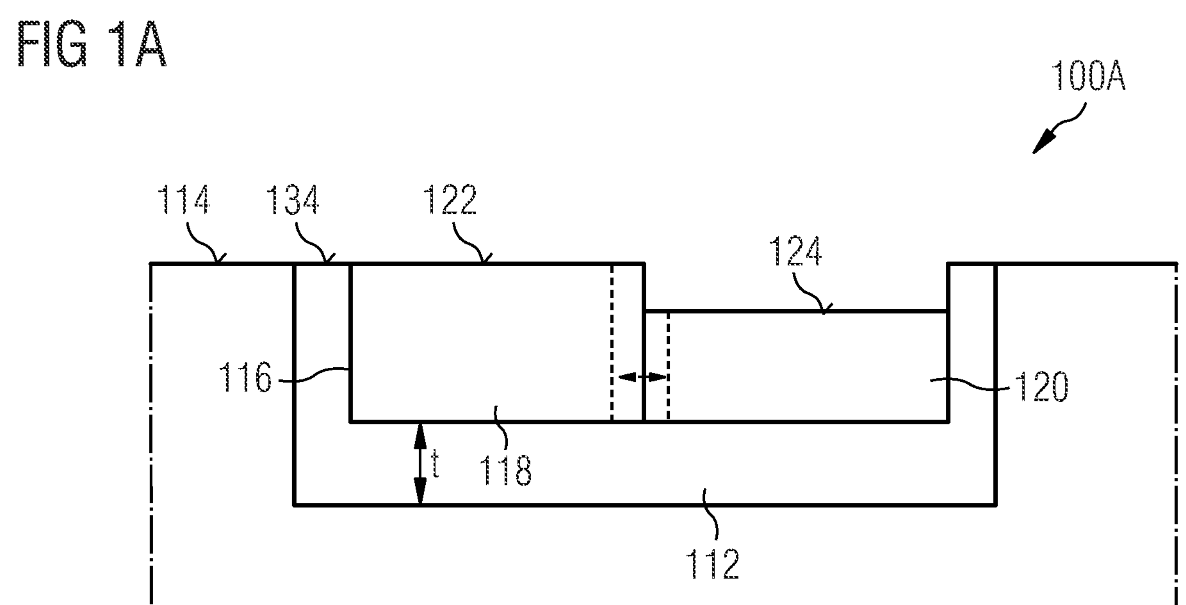
FIGS. 1A-1B illustrate partial cross-sectional views of exemplary semiconductor devices.

The making and using of several examples are discussed in detail below. It should be appreciated, however, that the present invention provides many applicable inventive concepts that can be embodied in a wide variety of specific contexts. The specific examples discussed are merely illustrative of specific ways to make and use the invention, and do not limit the scope of the invention.

The terms “having”, “containing”, “including”, “comprising” and the like are open, and the terms indicate the presence of stated structures, elements or features but do not preclude the presence of additional elements or features. The articles “a”, “an” and “the” are intended to include the plural as well as the singular, unless the context clearly indicates otherwise.

The terms “bonded”, “attached”, “connected” and/or “coupled” are not meant to mean that the elements or layers must directly be contacted together; intervening elements or layers may be provided between the “bonded”, “attached”, “connected” and/or “coupled” elements, respectively. However, in accordance with the disclosure, the above-mentioned terms may, optionally, also have the specific meaning that the elements or layers are directly contacted together, i.e., that no intervening elements or layers are provided between the “bonded”, “attached”, “connected” and/or “coupled” elements, respectively.

The term “electrically connected” describes a permanent low-resistive connection between electrically connected elements, for example a direct contact between the concerned elements or a low-resistive connection via a metal and/or heavily doped semiconductor material.

The terms “on” and “over” are not to be construed as meaning only “directly on” and “directly over”. Rather, if one element is positioned “on” or “over” another element (e.g., a layer is “on” or “over” another layer or “on” or “over” a substrate), a further component (e. g., a further layer) may be positioned between the two elements (e.g., a further layer may be positioned between a layer and a substrate if the layer is “on” or “over” said substrate).

Spatially relative terms, such as “beneath,” “below,” “lower,” “above,” “upper” and the like, are used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Each of the semiconductor substrates or substrate referred to herein may be manufactured based on a specific semiconductor material. Any standard type of semiconductor substrate can be used such as single element semiconductors (e.g. Si, Ge, etc.), silicon-on-insulator semiconductors, binary semiconductors (e.g. SiC, GaN, GaAs, etc.), ternary semiconductors (e.g. AlGaN, InGaAs, InAlAs, etc.). In this connection, a first semiconductor substrate and a second semiconductor substrate may be of identical semiconductor material or may be of different semiconductor materials.

FIG. 1A illustrates a partial cross-sectional view of an exemplary semiconductor device 100A. The semiconductor device 100A includes a substrate 110 and an isolation region 112 formed at a main surface 114 of the substrate 110. The main surface 114 may be referred to as a first main surface or a front surface. There is a second main surface (not illustrated) of the semiconductor substrate 110 opposite the first main surface 114. The second main surface may be referred to as back surface.

At least a portion of the isolation region 112 may be buried in the substrate 110 and the isolation region 112 may be formed in direct contact with the substrate 110. Alternatively, one or more layers may be interposed between the substrate 110 and the isolation region 112. The isolation region 112 comprises a dielectric material. In one example, the isolation region 112 may be a LOCOS (Local Oxidation of Silicon) region. In another example, the isolation region 112 may be an STI (Shallow Trench Isolation) region or any other type of isolation region that comprises, for example, at least one of grown and/or deposited oxide or nitride. The isolation region 112 may include a single insulating layer or insulating film, or it may include a stack of layers or films. As illustrated in the example of FIG. 1A, an upper surface 134 of the isolation region 112 may be approximately co-planar with the main surface 114 of the substrate. In another example, the upper surface 134 of the isolation region 112 may be below the main surface 114 of the substrate 110. In yet another example, the upper surface 134 of the isolation region 112 may be above the main surface 114 of the substrate 110.

A recess 116 is formed at the upper surface 134 of the isolation region 112. The recess 116 is a depressed portion provided in a manner to not penetrate through the isolation region 112. That means, the thickness t of the isolation region 112 is reduced but greater than zero in the recess 116. This way, a bottom surface of the recess 116 is disposed vertically between the upper surface 134 of the isolation region 112 and a bottom surface of the isolation region 112. The recess 116 has relatively large dimensions and thus would be prone to dishing after being filled, if a conventional planarization process were to be used.

An active or passive device is formed in the recess 116 and the active or passive device comprises a first semiconductor material region 118 and a second semiconductor material region 120. The first semiconductor material region 118 and the second semiconductor material region 120 may be confined to the recess 116. The first semiconductor material region 118 adjoins at least part of the second semiconductor material region 120 in a first direction x parallel to the main surface 114 of the substrate 110. The first semiconductor material region 118 has a first conductivity type and a first doping level and the second semiconductor material region 120 has a second conductivity type and a second doping level. In one example, the conductivity type may be referred to as doping type and/or the doping level may be referred to as dopant concentration. In one example, at least one of the first conductivity type and the first doping level is different from the second conductivity type and the second doping level. In another example, the first semiconductor material region 118 and/or second semiconductor material region 120 may include a single semiconductor layer. In another example, the first semiconductor material region 118 and/or the second semiconductor material region 120 may Include a stack of semiconductor layers and the various layers may have different conductivity types and/or different doping levels. The first semiconductor material region 118 and the second semiconductor material region 120 may comprise a same or a different semiconductor material.

An upper surface 124 of the second semiconductor material region 120 is below the main surface 114 of the substrate 110. Further, an upper surface 122 of the first semiconductor material region 118 is above the upper surface 124 of the second semiconductor material region 120. The difference in the levels of the upper surfaces 122, 124 is caused by a dishing prevention structure that is formed over the second semiconductor material region 120 and that is then removed in a later manufacturing step. Examples of various semiconductor devices including the dishing prevention structure will be illustrated and described in connection with various figures later herein. For all those exemplary semiconductor devices, the dishing prevention structure may be removed in a later manufacturing step.

In one example, the first semiconductor material region 118 and the second semiconductor material region 120 have different thicknesses. The first semiconductor material region 118 and the second semiconductor material region 120 may have the same doping type and similar doping level. The first semiconductor material region 118 and the second semiconductor material region 120 may be formed by a same method and under similar conditions. They may be a part of a resistive device in which the thinner material region allows for high resistance per wafer area ratio. The dishing prevention layer ensures that the thinner region thickness is not altered during the planarization processes reducing the resistance variability of the resistive device.

In another example, the first semiconductor material region 118 and/or the second semiconductor material region 120 comprises polycrystalline or amorphous Si, or polycrystalline or amorphous Ge, or polycrystalline or amorphous SiGe, or polycrystalline or amorphous SiC.

As indicated in FIG. 1A by dashed lines and by a double arrow, the border between the first semiconductor material region 118 and the second semiconductor material region 120 may shift to the right or to the left in the first direction x. This shift is caused by a diffusion of dopants that occurs during manufacturing of the semiconductor device 100A. As a consequence, one of the upper surface 122 of the first semiconductor material region 118 and the upper surface 124 of the second semiconductor material region 120 may have a step.

Figure 1B:
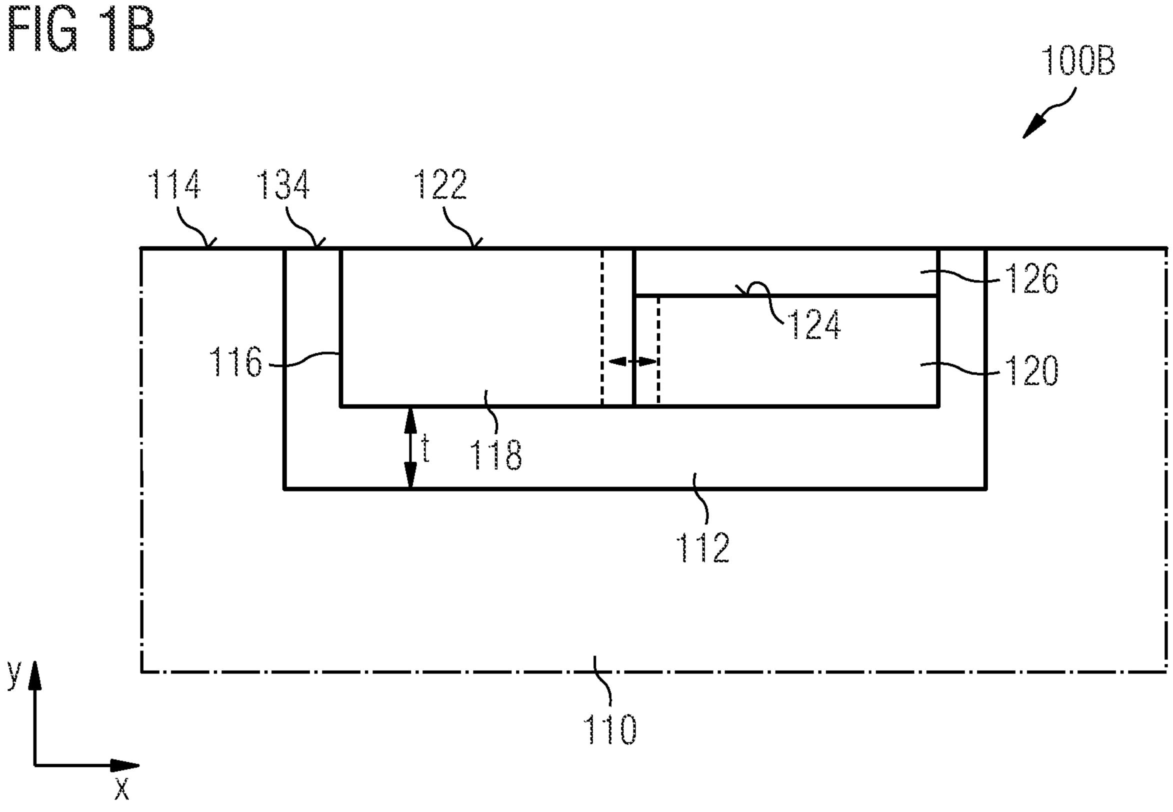

FIG. 1B illustrates a partial cross-sectional view of a further exemplary semiconductor device 100B. In contrast to the exemplary semiconductor device 100A of FIG. 1A, in the exemplary semiconductor device 100B of FIG. 13 the dishing prevention structure 126 is still present. The dishing prevention structure 126 is formed over at least a part of the second semiconductor material region 120. In one example, the dishing prevention structure 126 is formed over a major part of the second semiconductor material region 120. In one example, the dishing prevention structure 126 is provided directly on at least a part of the second semiconductor material region 120 and in another example, there are one or more intermediate layers between the dishing prevention structure 126 and the second semiconductor material region 120. As explained above and as indicated by dashed lines and by the double arrow, the position of the border between the first semiconductor material region 118 and the second semiconductor material region 120 may shift to the right of to the left in the first direction x due to diffusion of dopants. As a consequence, in one example, the dishing prevention structure 126 may extend from the second semiconductor material region 120 to a minor part of the first semiconductor material region 118. That means, the dishing prevention structure 126 is formed over a minor part of the first semiconductor material region 118.

As used herein, the term "dishing prevention structure" means a single material layer or stack of material layers that is configured to minimize or at least reduce dishing when planarizing structures with wide dimensions. In the case of the examples as shown in FIGS. 1A-1B, the dishing prevention structure 126 minimizes or at least reduces dishing when planarizing the first semiconductor material region 118 and/or the second semiconductor material region 120 formed in the recess 116, The dishing prevention structure 126 provides structural support during formation of the semiconductor devices 100A+100B to mitigate the amount of dishing of the first semiconductor material region 118 and/or the second semiconductor material region 120. The dishing prevention structure 126 may comprise, for example, an oxide (e.g., silicon oxide), a nitride (e.g., silicon nitride), an oxynitride (e.g., silicon oxynitride), or a combination of the foregoing. The dishing prevention structure 126 may comprise the same material as the isolation region 112.

In the case of planarization by CMP, the dishing prevention structure 126 may comprise a material or combination of materials suitable as an effective etch stop for CMP. The dishing prevention structure 126 may have a different CMP removal rate than the first semiconductor material region 118 and the second semiconductor material region 120 for a given CMP process. For example, the given CMP process, which has predefined process parameters, is performed on the dishing prevention structures 126 and the first semiconductor material region 118 and/or the second semiconductor material region 120. The CMP process may remove portions of the dishing prevention structure 126 at a first CMP removal rate, portions of the first semiconductor material region 118 at a second CMP removal rate and/or portions of the second semiconductor material region 120 at a third CMP removal rate. At least one of the second CMP removal rate and the third CMP removal rate is greater than the first CMP removal rate. In one example, the second CMP removal rate and the third CMP removal rate are equal. Because the dishing prevention structure 126 is embedded in the recess 116 and because at least one of the second CMP removal rate and the third CMP removal rate is greater than the first CMP removal rate, the dishing prevention structure 126 may reduce an amount of dishing to the first semiconductor material region 118 and/or the second semiconductor material region 120 caused by the given CMP process. Accordingly, performance of the semiconductor devices 100A+100B may be improved and/or a cost to fabricate the semiconductor devices 100A+100B may be reduced, It is to be noted, that in one example, the planarization by CMP may include multiple CMP process steps and CMP removal rates of the multiple CMP process steps may differ from each other.

Figure 2:
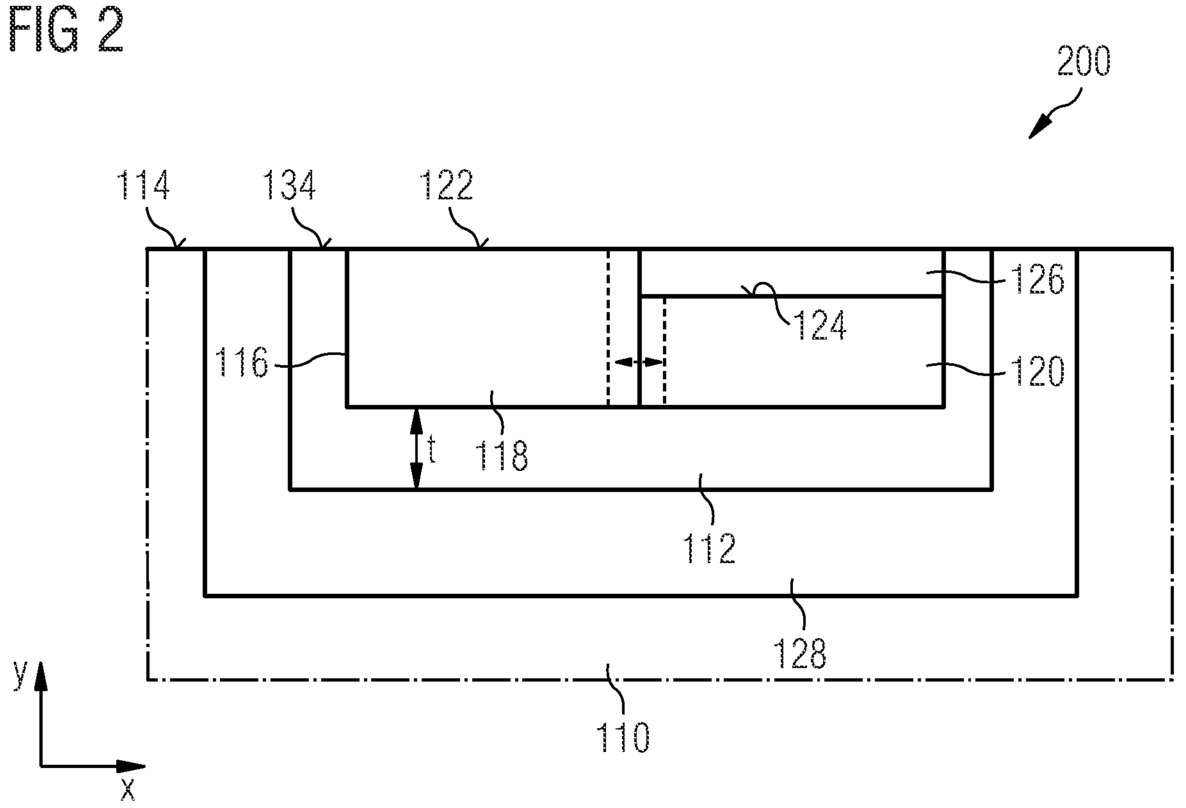
FIGS. 2-5 illustrate partial cross-sectional views of further exemplary semiconductor devices.

Another exemplary semiconductor device 200 is illustrated in a partial cross-sectional view of FIG. 2. The exemplary semiconductor device 200 of FIG. 2 differs from the exemplary semiconductor device 100B of FIG. 1B by a well region 128 in which the isolation region 112 is formed. The well region 128 is formed within the substrate 110 and a conductivity type of the well region 128 may be different from a conductivity type of the substrate 110. In one example, a dopant concentration of the well region 128 may not be constant throughout the well region 128 but the dopant concentration of the well region 128 may vary along a second direction y perpendicular to the main surface 114 of the substrate 110. A maximum dopant concentration of the well region 128 may be in a range between 1e17 cm-3 and 1e18 cm-3. The well region 128 may protect the isolation region 112 from stress that is caused by a hole current passing the well region 128. Exemplary semiconductor devices as illustrated and described earlier herein and as will be illustrated and described later herein may also include a well region 128.

The semiconductor devices 100A, 100B, 200 as illustrated and described in connection with FIGS. 1A-1B and FIG. 2 include the first semiconductor material region 118 and the second semiconductor material region 120 to form an active or passive device. In one example, the semiconductor devices 100A, 100B, 200 implement a pn junction that may be used as a diode, temperature sensor, etc. In this example, one of the first semiconductor material region 118 and the second semiconductor material region 120 is a p-type region and the other one of the first semiconductor material region 118 and the second semiconductor material region 120 is a n-type region.

Figure 3:
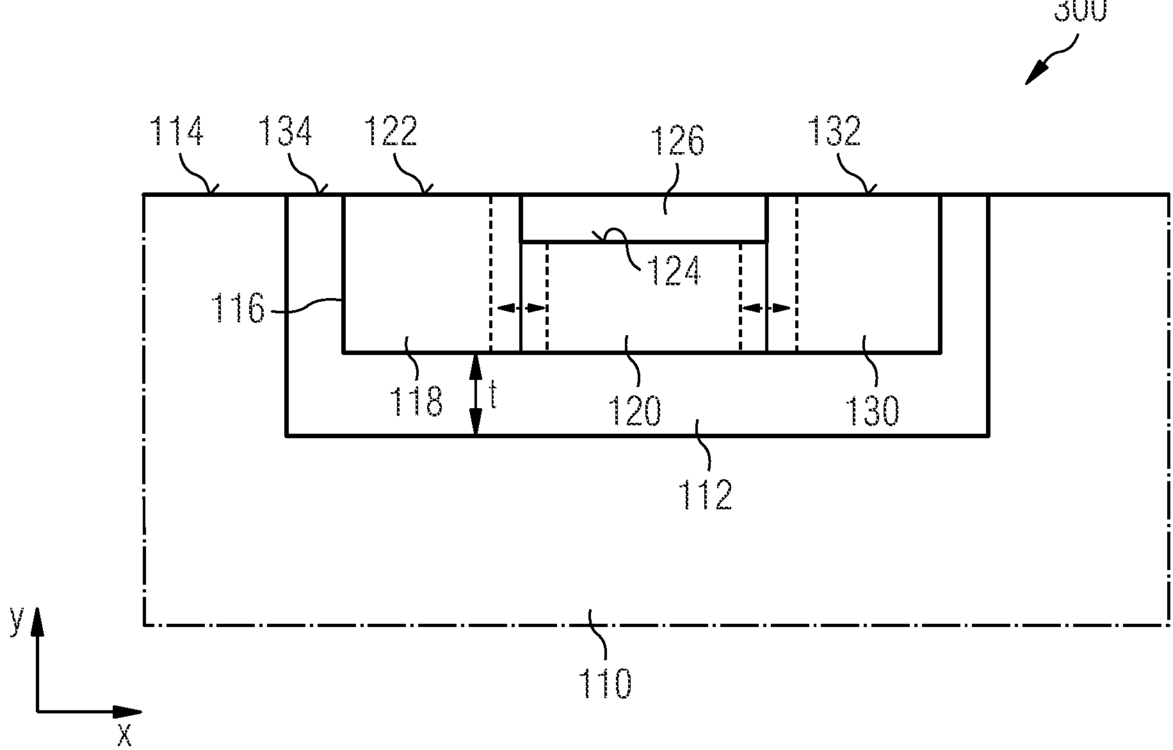

Another exemplary semiconductor device 300 is illustrated in a partial cross-sectional view of FIG. 3. The exemplary semiconductor device 300 of FIG. 3 differs from the exemplary semiconductor devices 100A, 100B, 200 of FIGS. 1A-1B and FIG. 2 by a third semiconductor material region 130 formed in the recess 116. As illustrated in FIG. 3, the third semiconductor material region 130 may adjoin the second semiconductor material region 120 in the first direction x parallel to the main surface 114 of the substrate 110. The third semiconductor material region 130 may form together with the first semiconductor material region 118 and the second semiconductor material region 120 an active or passive device. The third semiconductor material region 130 has a third conductivity type and a third doping level. The third conductivity type is the same as the first conductivity type and/or the second conductivity type. The third doping level may be the same as or different from the first doping level or the second doping level. In one example, an upper surface 132 of the third semiconductor material region 130 may be substantially co-planar with the upper surface 122 of the first semiconductor material region 118.

In one example, the semiconductor device 300 may include a transistor in the recess 116. The transistor may be a MOSFET (metal-oxide-semiconductor field effect transistor) or a bipolar transistor. The first semiconductor material region 118 includes a drain region or a collector region, the second semiconductor material region 120 includes a base region or a channel region, and the third semiconductor material region 130 includes an emitter region or a source region. The first conductivity type of the first semiconductor material region 118 is the same as the third conductivity type of the third semiconductor material region 130 and the second conductivity type of the second semiconductor material region 120 is different from the first/third conductivity type.

In another example, the semiconductor device 300 may include a resistor in the recess 116. The first semiconductor material region 118, the second semiconductor material region 120 and the third semiconductor material region 130 have all the same conductivity type. At least one of the first doping level of the first semiconductor material region 118, the second doping level of the second semiconductor material region 120 and the third doping level of the third semiconductor material region 130 is different from the two others of the first doping level of the first semiconductor material region 118, the second doping level of the second semiconductor material region 120 and the third doping level of the third semiconductor material region 130. For example, the second doping level of the second semiconductor material region 120 is higher than the first doping level of the first semiconductor material region 118 and higher than the third doping level of the third semiconductor material region 130. In this example, the first doping level of the first semiconductor material region 118 may be the same as the third doping level of the third semiconductor material region 130.

As indicated in FIG. 3 by dashed lines and by double arrows, the border between the first semiconductor material region 118 and the second semiconductor material region 120 and the border between the second semiconductor material region 120 and the third semiconductor material region 130 may shift to the right or to the left in the first direction x. This shift is caused by a diffusion of dopants that occurs during manufacturing of the semiconductor device 300. As a consequence, at least one of the upper surface 122 of the first semiconductor material region 118, the upper surface 124 of the second semiconductor material region 120 and the upper surface 132 of the third semiconductor material region 130 may have a step.

In the example as illustrated in FIG. 3, the dishing prevention structure 126 is formed over the second semiconductor material region 120. Generally, the dishing prevention structure 126 may be formed over at least a part of one of the first semiconductor material region 118, the second semiconductor material region 120 and the third semiconductor material region 130. In one example the dishing prevention structure 126 is formed over a major part of one of the first semiconductor material region 118, the second semiconductor material region 120 and the third semiconductor material region 130.

Figure 4:
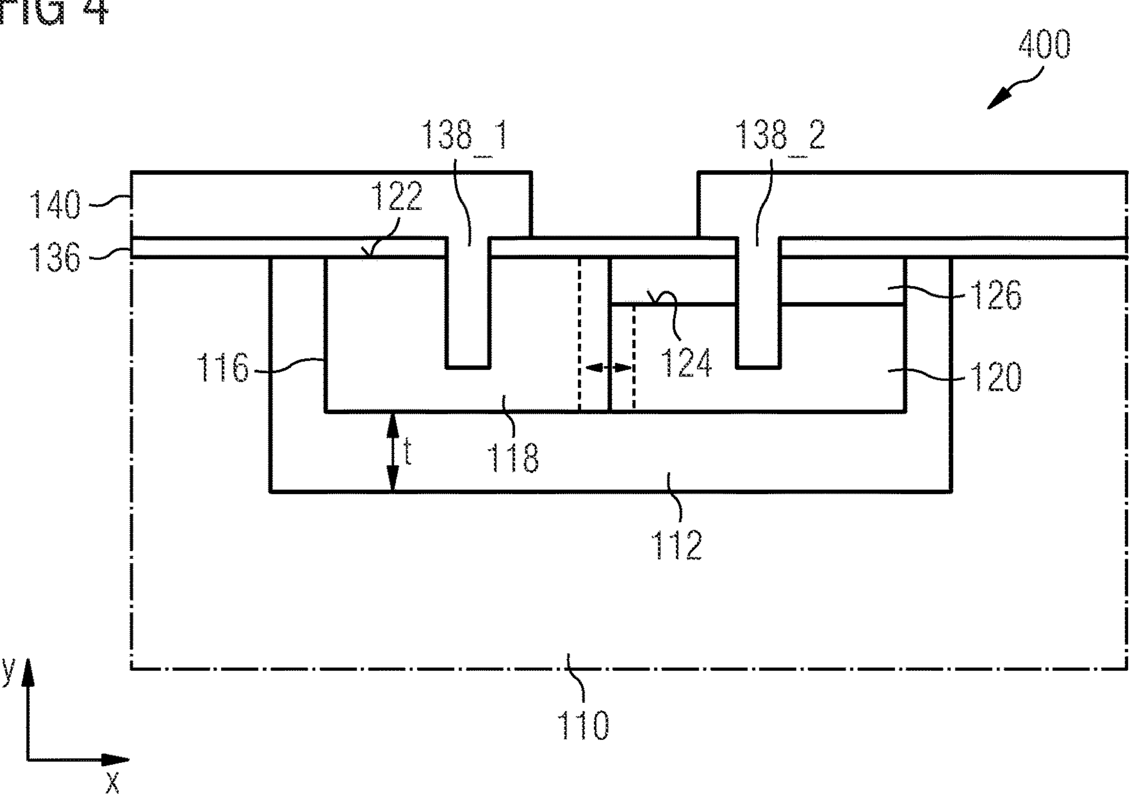

FIG. 4 illustrates a partial cross-sectional view of a further exemplary semiconductor device 400. The example of FIG. 4 is similar to the example illustrated in FIG. 1B. Differently, however, the semiconductor device 400 includes a dielectric layer 136 that is formed over the isolation region 112 and that contacts the dishing prevention structure 126 and the first semiconductor material region 118. The dielectric layer 136 may include a single layer of dielectric material or a stack of layers. Each layer of the stack of layers may include a different dielectric material.

The semiconductor device 400 further includes two contact openings 138_1, 138_2. At least one 138_1 of the two contact openings 138_1, 138_2 is formed in the dielectric layer 136 and extends at least to the first semiconductor material region 118. In the example as illustrated in FIG. 4, the contact opening 138_1 extends into the first semiconductor material region 118 but does not penetrate through the first semiconductor material region 118. In another example, the contact opening 138_1 may stop at the upper surface 122 of the first semiconductor material region 118, that is, a bottom surface of the contact opening 138_1 coincides with the upper surface 122 of the first semiconductor material region 118. In yet another example, the contact opening 138_1 extends to the bottom surface of the first semiconductor material region 118, that is, the bottom surface of the contact opening 138_1 coincides with the bottom surface of the first semiconductor material region 118. In yet another example, the contact opening 138_1 penetrates through the first semiconductor material region 118, that is, the bottom surface of the contact opening 138_1 is below the bottom surface of the first semiconductor material region 118.

The semiconductor device 400 further includes an electrically conductive material 140 that is formed over the dielectric layer 136. The electrically conductive material 140 fills the contact opening 138_1 to make electrical contact with the first semiconductor material region 118. The electrically conductive material 140 may comprise a metal (e. g., Al, Cu, etc.), highly doped polysilicon, etc.

In the exemplary semiconductor device 400 as illustrated in FIG. 4, the other one 138_2 of the two contact openings 138_1, 138_2 is formed in the dielectric layer 136 and in the dishing prevention layer 126. The contact opening 138_2 extends through the dielectric layer 136 and through the dishing prevention layer 126 to the second semiconductor material region 120. In the example as illustrated in FIG. 4, the contact opening 138_2 extends into the second semiconductor material region 120 but does not penetrate through the second semiconductor material region 120. Alternatively, the contact opening 138_2 may stop at the upper surface 124 of the second semiconductor material region 120, that is, a bottom surface of the contact opening 138_2 coincides with the upper surface 124 of the second semiconductor material region 120. In yet another example, the contact opening 138_2 extends to the bottom surface of the second semiconductor material region 120, that is, the bottom surface of the contact opening 138_2 coincides with the bottom surface of the second semiconductor material region 120. In yet another example, the contact opening 138_2 penetrates through the second semiconductor material region 120, that is, the bottom surface of the contact opening 138_2 is below the bottom surface of the second semiconductor material region 120. The electrically conductive material 140 fills the contact opening 138_2 to make electrical contact with the second semiconductor material region 120.

In another example (not illustrated), the other one 138_2 of the two contact openings 138_1, 138_2 is formed in the dielectric layer 136 but not in the dishing prevention layer 126. Referring to FIG. 3, the at least one 138_1 of the two contact openings 138_1, 138_2 may be formed to make electrical contact with the first semiconductor material region 118 and the other one 138_2 of the two contact openings 138_1, 138_2 may be formed to make electrical contact with the third semiconductor material region 130. In this example, there may be no electrical contact to the second semiconductor material region 120 via any contact openings.

Figure 5:
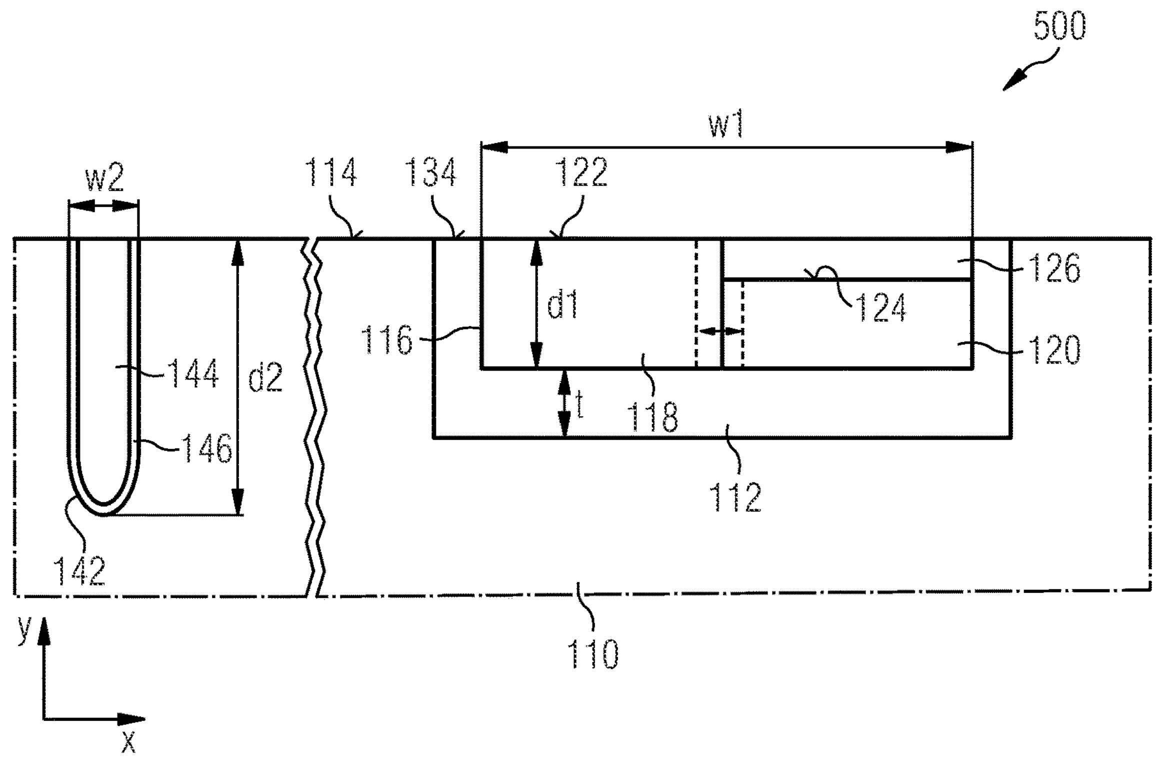

A further exemplary semiconductor device 500 is illustrated in a partial cross-sectional view of FIG. 5. The exemplary semiconductor device 500 differs from the exemplary semiconductor device 100B of FIG. 1B by a gate trench 142 that is formed in the substrate 110. The gate trench 142 extends from the main surface 114 of the substrate 110 into the substrate 110 in the second direction y. The gate trench 142 is at least partly filled with a same semiconductor material as one of the first semiconductor material region 118 or the second semiconductor material region 120. The semiconductor material that fills the gate trench 142 provides a gate electrode 144. With such a structure, the gate electrode 144 can be formed in a same manufacturing step as one of the first semiconductor material region 118 or the second semiconductor material region 120. Therefore, the manufacturing cost of the semiconductor device 500 can be reduced. Alternatively, the gate trench 142 is at least partly filled with a semiconductor material that is different from the first semiconductor material region 118 and/or the second semiconductor material region 120. The gate trench 142 further includes a gate dielectric layer 146 covering inner trench walls and insulating the gate electrode 144 from the substrate 110.

As illustrated in FIG. 5, the recess 116 extends from the main surface 114 of the substrate 110 to a first depth d1 within the substrate 110 and the gate trench 142 extends from the main surface 114 of the substrate 110 to a second depth d2 within the substrate 110. The second depth d2 is greater than the first depth d1. Furthermore, the gate trench 142 has a second width w2 and the recess 116 has a first width w1 which is greater than the second width w2 of the gate trench 142.

The gate trench 142 may have a second aspect ratio greater than a first aspect ratio of the recess 116. The aspect ratio of the gate trench 142 and the recess 116, respectively, is defined by the depth d1, d2 (i. e., the extension along the second direction y) divided by the width w1, w2 (i. e., the extension along the first direction x). In one example, the first aspect ratio of the recess 116 may be less than 1, e.g. less than 0.5, e.g. less than 0.1, e.g. less than 0.01, or even less. Further, the second aspect ratio of the gate trench 142 may be greater than 1, e.g. greater than 5, e.g. greater than 10, or even greater. The first width w1 of the recess 116 may be in the range from about 2 μm to about 20 μm, or even greater than 20 μm, e.g. in the range from about 10 μm to about 100 μm. The second width w2 of the gate trench 142 may be in the range from about 0.1 μm to about 2 μm. The first depth d1 of the recess 116 may be in the range from about 0.1 μm to about 2 μm. The second depth d2 of the gate trench 142 may be in the range from about 1 μm to about 5 μm, or even greater than 5 μm or less than 1 μm.

In some examples (not illustrated), contact openings may be formed in the semiconductor device 500 to make electrical contact to the first semiconductor material region 118 and/or the second semiconductor material region 120 and/or other regions within the semiconductor device 500. The recess 116 may include at least one more semiconductor material region in addition to first semiconductor material region 118 and the second semiconductor material region 120. The gate dielectric layer 146 may be formed over at least a part of the main surface 114 of the substrate 110.

In one example (not illustrated), a semiconductor device 100A, 100B, 200-500 as illustrated and described in connection with FIGS. 1A-1B and FIGS. 2-5 further includes a gated device and/or a trench-based device, e.g. a power transistor device, that is at least partly formed in the substrate 110 and that is formed in an active cell region of the semiconductor device. The power transistor device may be a vertical power transistor device which includes a plurality of gate trench structures similar to the gate trench 142 as illustrated and described in connection with FIG. 5. The vertical power transistor device may be configured to conduct currents of more than 1 A or more than 10 A or even more than 30 A and may be further configured to block voltages between load terminals in the range of several hundreds up to several thousands of volts, e. g. 400 V, 650V, 1.2 kV, 1.7 kV, 3.3 kV, 4,5 kV, 5.5 kV, 6 kV, 6.5 kV. The active or passive device formed in the recess 116 comprises at least one of a diode, transistor or resistor. The active or passive device is formed in a further region of the semiconductor device that may be referred to as added functionality region.

In one example, a resistor is formed in the recess 116 that is electrically coupled to a gate electrode of the power transistor device. In another example, a diode is formed in the recess 116 that is configured to sense a temperature of the at least one power transistor device. The temperature sense diode may be at least partly surrounded on a plane parallel to the main surface 114 of the substrate 110 by elements, e.g., gate trenches, of the power transistor device.

FIGS. 6A-6E illustrate a series of cross-sectional views of an exemplary method of manufacturing a semiconductor device, The method as will be described in connection with FIGS. 6A-6E may be used to manufacture a semiconductor device similar to one of the semiconductor devices 100A, 100B, 200-500 as illustrated and described in connection with FIGS. 1A-1B and FIGS. 2-5.

Figure 6A:
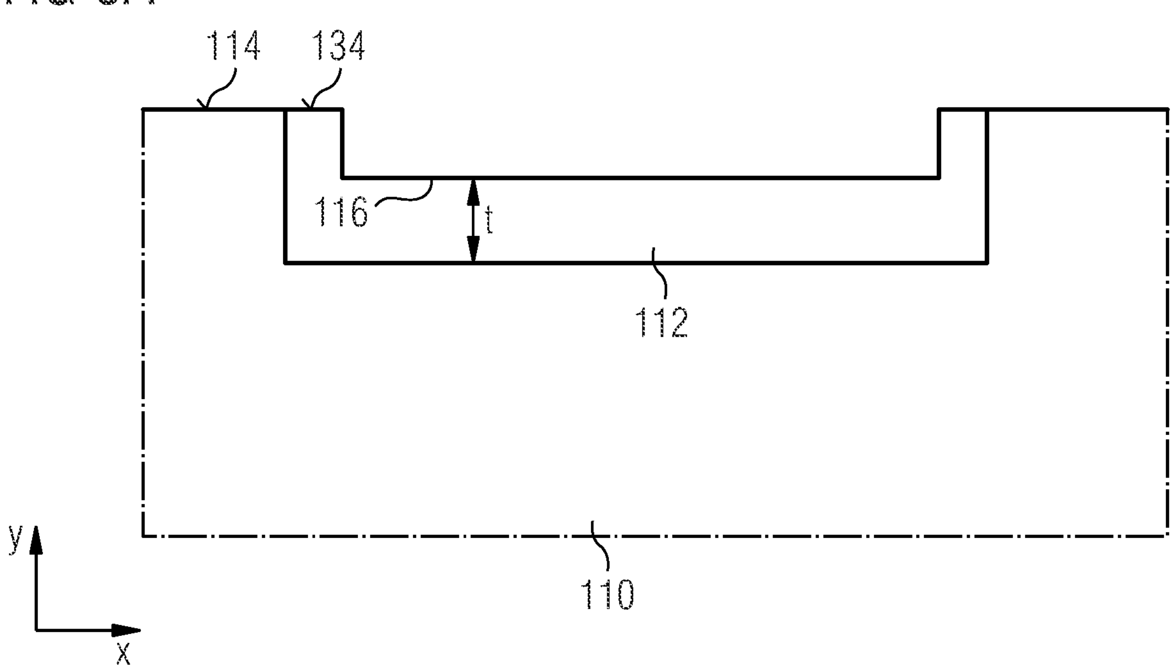
FIGS. 6A-6E illustrate a series of cross-sectional views of an exemplary method of manufacturing a semiconductor device.

As shown in FIG. 6A, an isolation region 112 is formed at a main surface 114 of a substrate 110. The isolation region 112 may comprise a dielectric material as described in connection with FIG. 1A. In one example (not illustrated), an upper surface 134 of the isolation region 112 may be above the main surface 114 of the substrate 110. A recess 116 as described in connection with FIG. 1A is formed at the upper surface 134 of the isolation region 112. The recess 116 may be formed using a standard etching process.

Figure 6B:
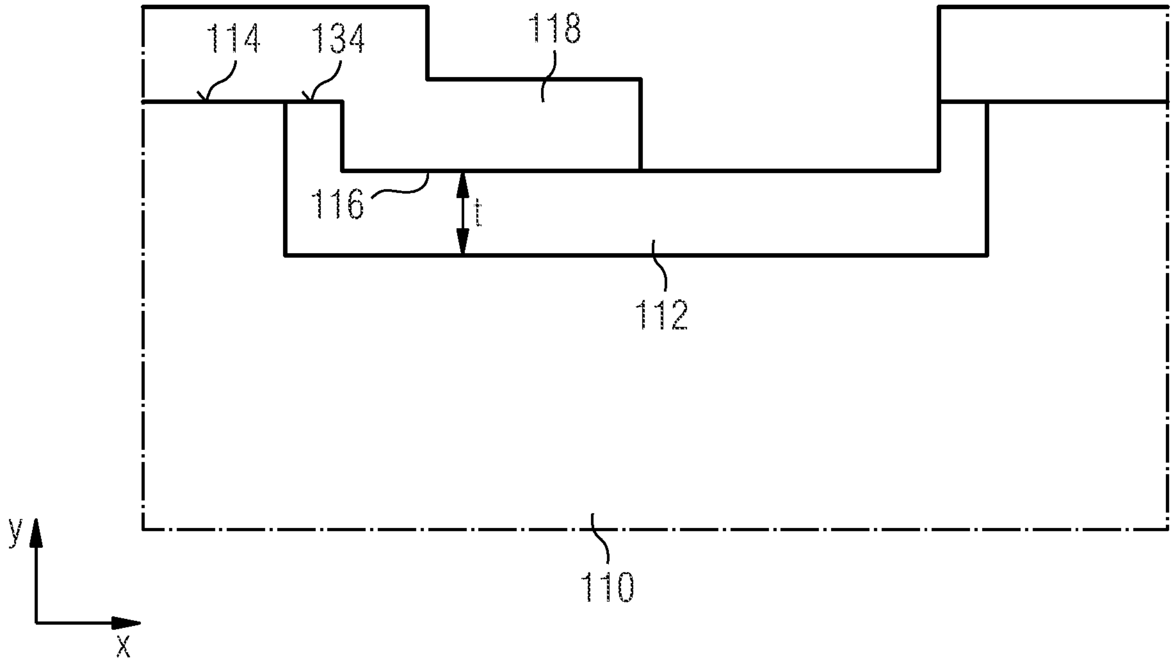

As shown in FIG. 6B, a first semiconductor material region 118 is formed at least in a first region of the recess 116. The first semiconductor material region 118 may be formed by a deposition, e.g., chemical vapor deposition, atomic layer deposition, or any other suitable deposition technique. The first semiconductor material region 118 has a first conductivity type and a first doping level. The forming of the first semiconductor material region 118 in the first region of the recess 116 may include forming the first semiconductor material region 118 over the isolation region 112 and after that structuring the first semiconductor material region 118. In one example (not illustrated), a gate trench as illustrated and described in connection with FIG. 5 is filled with the first semiconductor material region 118 in a same manufacturing step as the first semiconductor material region 118 is formed at least in the first region of the recess 116.

Figure 6C:
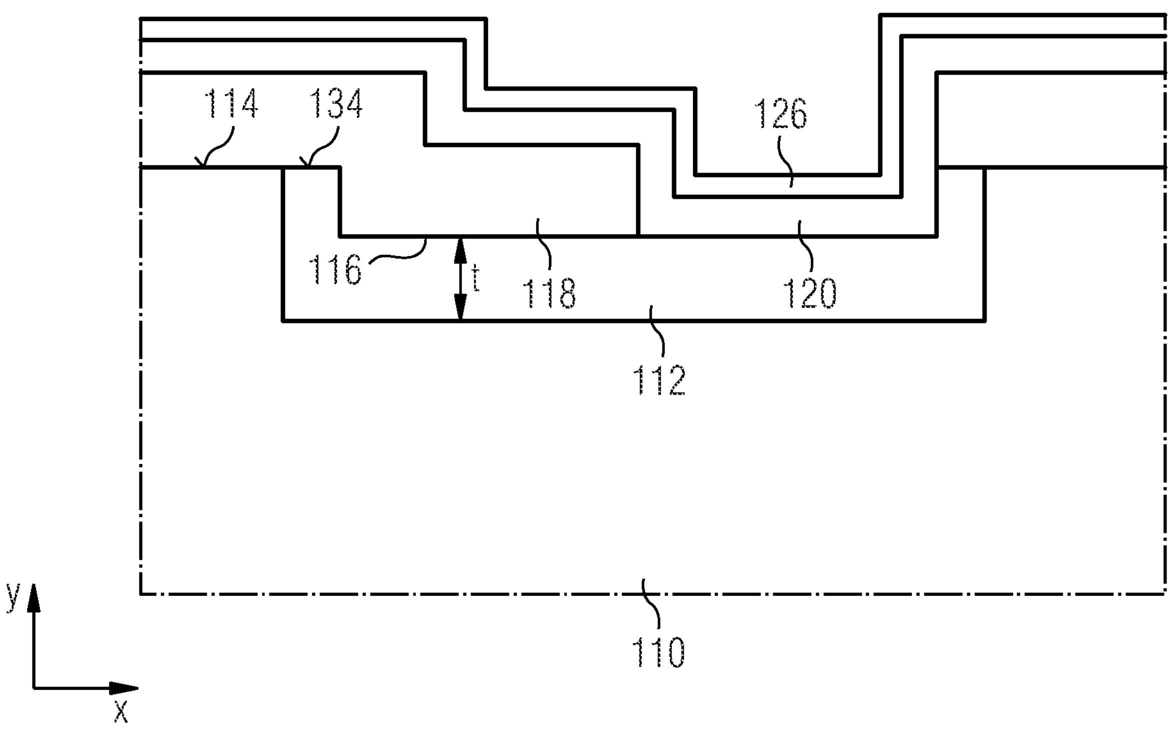

As shown in FIG. 6C, a second semiconductor material region 120 is formed at least in a second region of the recess 116 that is distinct from the first region. In one example, the first semiconductor material region 118 adjoins at least part of the second semiconductor material region 120 in a first direction x parallel to the main surface 114 of the substrate 110. Further, the second semiconductor material region 120 is formed over the first semiconductor material region 118. The second semiconductor material region 120 may be formed by deposition similar as described earlier herein for the first semiconductor material region 118. The second semiconductor material region 120 has a second conductivity type and a second doping level. At least one of the first conductivity type and the first doping level is different from the second conductivity type and the second doping level.

In one example, the first semiconductor material region 118 and/or the second semiconductor material region 120 may be doped in-situ during deposition or may be doped subsequently after deposition. In one example, the first semiconductor material region 118 and/or the second semiconductor material region 120 may comprise polysilicon. As already described in connection with FIG. 1A, the first semiconductor material region 118 and/or the second semiconductor material region 120 may include a stack of semiconductor layers and the various layers may have different conductivity types and/or different doping levels.

FIG. 6C further shows a dishing prevention structure 126 that is formed over the first semiconductor material region 118 and the second semiconductor material region 120. The dishing prevention structure 126 may be formed by deposition similar as described earlier herein for the first semiconductor material region 118. The dishing prevention structure 126 may be formed directly over the second semiconductor material region 120, i.e., the dishing prevention structure 126 may directly contact the second semiconductor material region 120. The first semiconductor material region 118 may be separated from the dishing prevention structure 126 by the second semiconductor material region 120. As already described in connection with FIG. 1B, the dishing prevention structure 126 may include a single material layer or a stack of material layers.

Figure 6D:
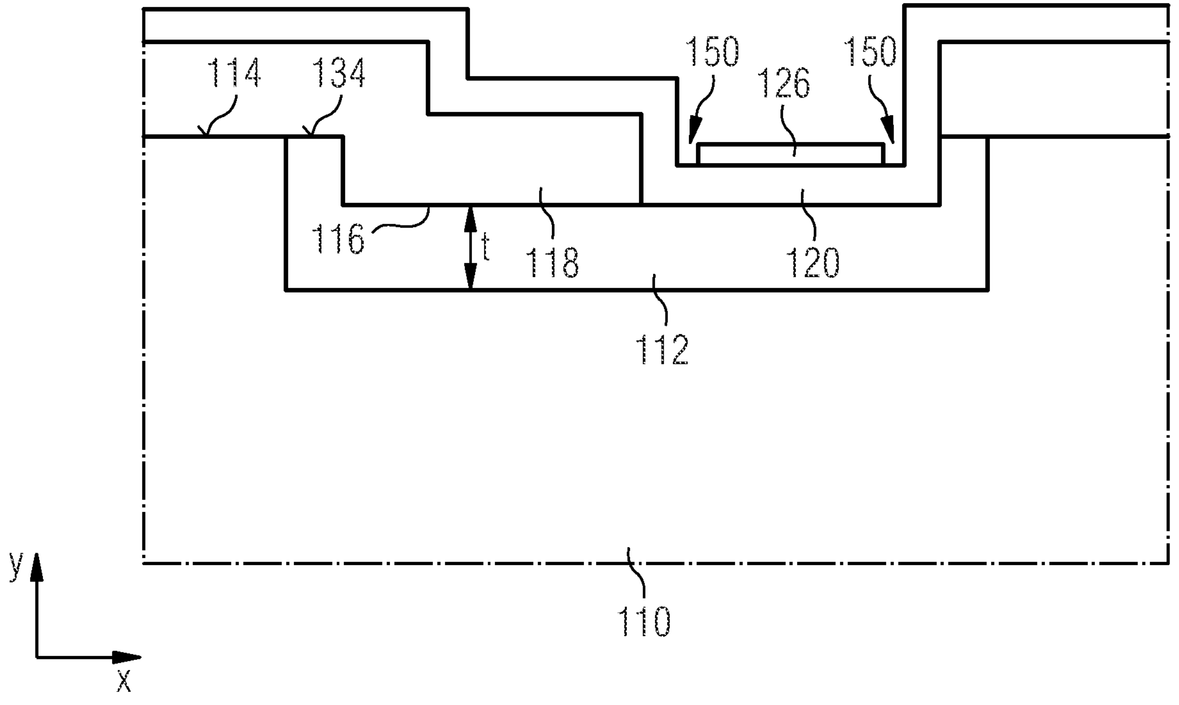

FIG. 6D shows an optional manufacturing step in which the dishing prevention structure 126 is structured in a dedicated etching process. For example, the dishing prevention structure 126 may be structured in a way that part of the dishing prevention structure 126 is removed in edge regions 150. The edge regions 150 may be referred to as peripheral regions of the dishing prevention structure 126. As a result, there is a gap between sidewalls of the dishing prevention structure 126 and the second semiconductor material region 120 after the dedicated etching process has been performed.

Figure 6E:
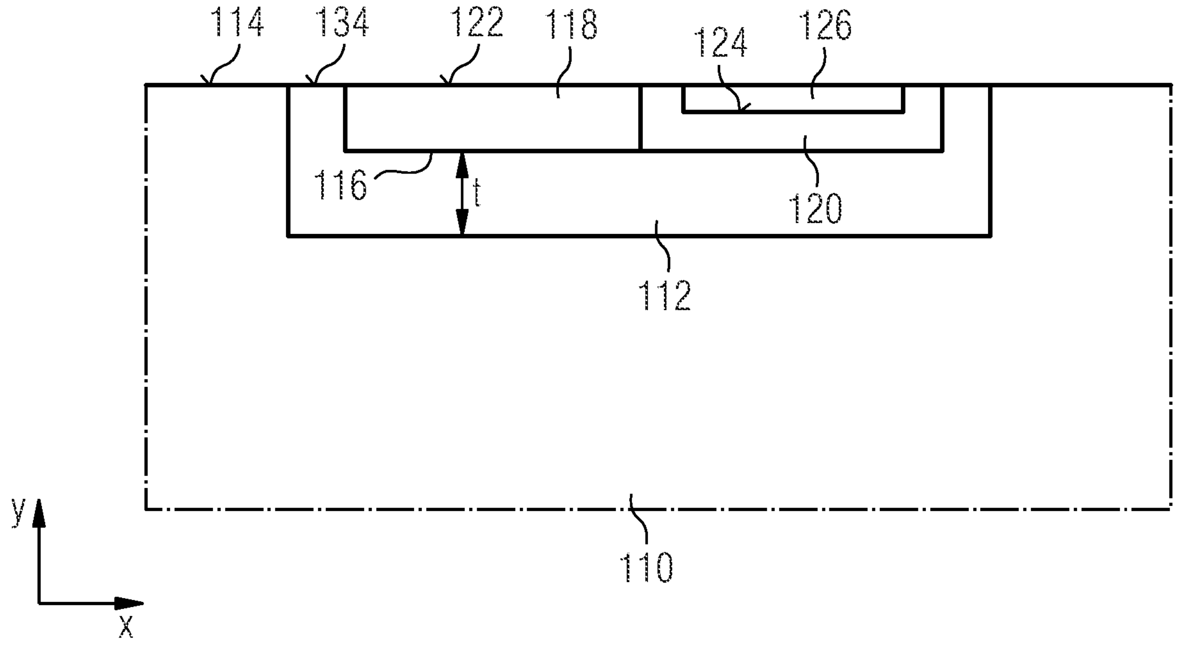

FIG. 6E shows the semiconductor device of FIG. 60 after a planarization step has been performed. During the planarization step, the first semiconductor material region 118 and the second semiconductor material region 120 is removed from the main surface 114 of the semiconductor substrate 110. Any standard planarization processes may be used, like e.g., CMP. It is to be noted, that in one example, also part of the isolation region 112 and/or part of the dishing prevention structure 126 may be removed during the planarization step. It is further to be noted, that the position of the border between the first semiconductor material region 118 and the second semiconductor material region 120 may shift to the right of to the left in the first direction x due to diffusion of dopants as described earlier herein.

In an optional manufacturing step (not illustrated), the dishing prevention structure 126 is completely removed to form a semiconductor device similar to the semiconductor device 100A as illustrated and described in connection with FIG. 1A.

In another further manufacturing step (not illustrated), a dielectric layer is formed over the isolation region 112, the dishing prevention structure 126 and the first semiconductor material region 118. In a subsequent manufacturing step, at least two contact openings are formed. At least one of the at least two contact openings is formed in the dielectric layer to extend at least to the first semiconductor material region 118. In a subsequent manufacturing step, the at least one of the at least two contact openings is filled with an electrically conductive material to make electrical contact with the first semiconductor material region 118. The manufacturing process may result in a semiconductor device similar to the semiconductor device 400 as illustrated and described in connection with FIG. 4.

FIG. 7 illustrates a flowchart of an exemplary method of manufacturing a semiconductor device. The method may be applied to manufacture a semiconductor device as illustrated and described earlier herein in connection with FIGS. 1A-1B, FIGS. 2-5 and FIGS. 6A-6E.

At step S1, an isolation region is formed at a main surface of a substrate.

At step S2, a recess is formed in the isolation region.

At step S3, a first semiconductor material is formed at least in a first region of the recess. The first semiconductor material has a first conductivity type and a first doping level.

At step S4, a second semiconductor material is formed at least in a second region of the recess that is distinct from the first region. The second semiconductor material is further formed over the first semiconductor material. The second semiconductor material has a second conductivity type and a second doping level. The first semiconductor material adjoins at least part of the second semiconductor material in a first direction parallel to the main surface of the substrate.

At step S5, a dishing prevention structure is formed over the first semiconductor material and the second semiconductor material.

Examples of the present invention are summarized here. Other examples can also be understood from the entirety of the specification and the claims filed herein.

Example 1: A semiconductor device, comprising: a substrate; an isolation region formed at a main surface of the substrate; a recess in the isolation region; and an active or passive device formed in the recess, the active or passive device comprising a first semiconductor material region and a second semiconductor material region, wherein the first semiconductor material region adjoins at least part of the second semiconductor material region in a first direction parallel to the main surface of the substrate, wherein an upper surface of the first semiconductor material region is above an upper surface of the second semiconductor material region, and wherein the upper surface of the second semiconductor material region is below the main surface of the substrate.

Example 2: The semiconductor device of example 1, further comprising a dishing prevention structure over at least a part of the second semiconductor material region.

Example 3: The semiconductor device of example 2, wherein the dishing prevention structure is formed over a major part of the second semiconductor material region.

Example 4: The semiconductor device of one of examples 2 or 3, wherein the dishing prevention structure comprises a same material as the isolation region.

Example 5: The semiconductor device of one of examples 2 to 4, wherein the dishing prevention structure is provided directly on the at least a part of the second semiconductor material region.

Example 6: The semiconductor device of one of examples 2 to 5, wherein the dishing prevention structure comprises a stack of layers.

Example 7: The semiconductor device of one of the proceeding examples, wherein the first semiconductor material region has a first conductivity type and a first doping level, the second semiconductor material region has a second conductivity type and a second doping level, and wherein at least one of the first conductivity type and the first doping level is different from the second conductivity type and the second doping level.

Example 8: The semiconductor device of one of examples 2 to 7, further comprising a dielectric layer over the isolation region and contacting the dishing prevention structure and the first semiconductor material region; at least two contact openings, wherein at least one of the at least two contact openings is formed in the dielectric layer and extends at least to the first semiconductor material region; and an electrically conductive material over the dielectric layer that fills the at least one of the at least two contact openings to make electrical contact with the first semiconductor material region.

Example 9: The semiconductor device of example 8, wherein the other one of the at least two contact openings is formed in the dielectric layer and in the dishing prevention structure, and wherein the electrically conductive material fills the other one of the at least two contact openings to make electrical contact with the second semiconductor material region.

Example 10: The semiconductor device of one of the proceeding examples, further comprising: a gate trench extending from the main surface of the substrate into the substrate in a second direction perpendicular to the main surface of the substrate, wherein the gate trench is at least partly filled with a same material as one of the first semiconductor material region or the second semiconductor material region.

Example 11: The semiconductor device of example 10, wherein a width of the recess is greater than a width of the gate trench, and wherein a depth of the gate trench is greater than a depth of the recess.

Example 12: The semiconductor device of one of the proceeding examples, wherein the active or passive device comprises at least one of a diode, transistor or resistor.

Example 13: The semiconductor device of example 12, further comprising: at least one power transistor device at least partly formed in the substrate, wherein the active or passive device comprises a diode that is configured to sense a temperature of the at least one power transistor device.

Example 14: The semiconductor device of one of the proceeding examples, wherein the substrate comprises a well region, and wherein the isolation region is formed in the well region.

Example 15: A method of manufacturing a semiconductor device, the method comprising: forming an isolation region at a main surface of a substrate; forming a recess in the isolation region; forming a first semiconductor material at least in a first region of the recess, the first semiconductor material having a first conductivity type and a first doping level; forming a second semiconductor material at least in a second region of the recess that is distinct from the first region and further forming the second semiconductor material over the first semiconductor material, the second semiconductor material having a second conductivity type and a second doping level, wherein the first semiconductor material adjoins at least part of the second semiconductor material in a first direction parallel to the main surface of the substrate; and forming a dishing prevention structure over the first semiconductor material and the second semiconductor material.

Example 16: The method of example 15, wherein at least one of the first conductivity type and the first doping level is different from the second conductivity type and the second doping level.

Example 17: The method of one of examples 15 or 16, further comprising: forming a gate trench, the gate trench extending from the main surface of the substrate into the substrate in a second direction perpendicular to the main surface of the substrate; and filling the gate trench with the first semiconductor material.

Example 18: The method of one of examples 15 to 17, further comprising: planarizing to remove the first semiconductor material and the second semiconductor material from the main surface of the substrate.

Example 19: The method of example 18, further comprising: before the planarizing, structuring the dishing prevention structure.

Example 20: The method of one of examples 18 or 19, further comprising: after the planarizing, forming a dielectric layer over the isolation region, the dishing prevention structure and the first semiconductor material; forming at least two contact openings, wherein at least one of the at least two contact openings is formed in the dielectric layer to extend at least to the first semiconductor material; and filling the at least one of the at least two contact openings with an electrically conductive material to make electrical contact with the first semiconductor material.

While this invention has been described with reference to illustrative examples, this description is not intended to be construed in a limiting sense. Various modifications and combinations of the illustrative examples, as well as other examples of the invention, will be apparent to persons skilled in the art upon reference to the description. It is therefore intended that the appended claims encompass any such modifications or examples.

What is claimed is:

1. A semiconductor device, comprising:

a substrate;

an isolation region formed at a main surface of the substrate;

a recess in the isolation region;

an active or passive device formed in the recess, the active or passive device comprising a first semiconductor material region and a second semiconductor material region; and a dishing prevention structure over at least a part of the second semiconductor material region, wherein the first semiconductor material region adjoins at least part of the second semiconductor material region in a first direction parallel to the main surface of the substrate, wherein an upper surface of the first semiconductor material region is above an upper surface of the second semiconductor material region, wherein the upper surface of the second semiconductor material region is below the main surface of the substrate.

2. The semiconductor device of claim 1, wherein the dishing prevention structure is formed over a major part of the second semiconductor material region.

3. The semiconductor device of claim 1, wherein the dishing prevention structure comprises a same material as the isolation region.

4. The semiconductor device of claim 1, wherein the dishing prevention structure is provided directly on the at least a part of the second semiconductor material region.

5. The semiconductor device of claim 1, wherein the dishing prevention structure comprises a stack of layers.

6. The semiconductor device of claim 1, further comprising:

a dielectric layer over the isolation region and contacting the dishing prevention structure and the first semiconductor material region;

at least two contact openings, wherein a first one of the at least two contact openings is formed in the dielectric layer and extends at least to the first semiconductor material region; and an electrically conductive material over the dielectric layer that fills the first one of the at least two contact openings to make electrical contact with the first semiconductor material region.

7. The semiconductor device of claim 6, wherein a second one of the at least two contact openings is formed in the dielectric layer and in the dishing prevention structure, and wherein the electrically conductive material fills the second one of the at least two contact openings to make electrical contact with the second semiconductor material region.

8. The semiconductor device of claim 1, wherein the first semiconductor material region has a first conductivity type and a first doping level, wherein the second semiconductor material region has a second conductivity type and a second doping level, and wherein at least one of the first conductivity type and the first doping level is different from the second conductivity type and the second doping level.

9. The semiconductor device of claim 1, further comprising:

a gate trench extending from the main surface of the substrate into the substrate in a second direction perpendicular to the main surface of the substrate, wherein the gate trench is at least partly filled with a same material as one of the first semiconductor material region or the second semiconductor material region.

10. The semiconductor device of claim 9, wherein a width of the recess is greater than a width of the gate trench, and wherein a depth of the gate trench is greater than a depth of the recess.

11. The semiconductor device of claim 1, further comprising:

at least one power transistor device at least partly formed in the substrate, wherein the active or passive device comprises a diode that is configured to sense a temperature of the at least one power transistor device.

12. The semiconductor device of claim 1, wherein the substrate comprises a well region, and wherein the isolation region is formed in the well region.

13. A method of manufacturing a semiconductor device, the method comprising:

forming an isolation region at a main surface of a substrate;

forming a recess in the isolation region;

forming a first semiconductor material at least in a first region of the recess, the first semiconductor material having a first conductivity type and a first doping level;

forming a second semiconductor material at least in a second region of the recess that is distinct from the first region and further forming the second semiconductor material over the first semiconductor material, the second semiconductor material having a second conductivity type and a second doping level, wherein the first semiconductor material adjoins at least part of the second semiconductor material in a first direction parallel to the main surface of the substrate; and forming a dishing prevention structure over the first semiconductor material and the second semiconductor material.

14. The method of claim 13, wherein at least one of the first conductivity type and the first doping level is different from the second conductivity type and the second doping level.

15. The method of claim 13, further comprising:

forming a gate trench that extends from the main surface of the substrate into the substrate in a second direction perpendicular to the main surface of the substrate; and filling the gate trench with the first semiconductor material.

16. The method of claim 13, further comprising:

planarizing to remove the first semiconductor material and the second semiconductor material from the main surface of the substrate.

17. The method of claim 16, further comprising:

before the planarizing, structuring the dishing prevention structure.

18. The method of claim 16, further comprising:

after the planarizing, forming a dielectric layer over the isolation region, the dishing prevention structure, and the first semiconductor material;

forming at least two contact openings, wherein at least one of the at least two contact openings is formed in the dielectric layer to extend at least to the first semiconductor material; and filling the at least one of the at least two contact openings with an electrically conductive material to make electrical contact with the first semiconductor material.

19. A semiconductor device, comprising:

a substrate;

an isolation region formed at a main surface of the substrate;

a recess in the isolation region;

an active or passive device formed in the recess, the active or passive device comprising a first semiconductor material region and a second semiconductor material region; and at least one power transistor device at least partly formed in the substrate, wherein the active or passive device comprises a diode that is configured to sense a temperature of the at least one power transistor device, wherein the first semiconductor material region adjoins at least part of the second semiconductor material region in a first direction parallel to the main surface of the substrate, wherein an upper surface of the first semiconductor material region is above an upper surface of the second semiconductor material region, wherein the upper surface of the second semiconductor material region is below the main surface of the substrate.

20. A semiconductor device, comprising:

a substrate;

an isolation region formed at a main surface of the substrate;

a recess in the isolation region; and an active or passive device formed in the recess, the active or passive device comprising a first semiconductor material region and a second semiconductor material region, wherein the first semiconductor material region adjoins at least part of the second semiconductor material region in a first direction parallel to the main surface of the substrate, wherein an upper surface of the first semiconductor material region is above an upper surface of the second semiconductor material region, wherein the upper surface of the second semiconductor material region is below the main surface of the substrate, wherein the substrate comprises a well region, wherein the isolation region is formed in the well region.

* * * * *